United States Patent
Takeda

[11] Patent Number: 5,473,259
[45] Date of Patent: Dec. 5, 1995

[54] SEMICONDUCTOR DEVICE TESTER CAPABLE OF SIMULTANEOUSLY TESTING A PLURALITY OF INTEGRATED CIRCUITS AT THE SAME TEMPERATURE

[75] Inventor: Kunihiro Takeda, Tokyo, Japan

[73] Assignee: NEC Corporation, Tokyo, Japan

[21] Appl. No.: 366,097

[22] Filed: Dec. 29, 1994

[30] Foreign Application Priority Data

Dec. 29, 1993  [JP]  Japan ................................. 5-352381

[51] Int. Cl.⁶ ...................................................... G01R 1/04
[52] U.S. Cl. .......................................... 324/760; 324/765
[58] Field of Search ............................... 324/158.1, 73.1, 324/760, 765; 219/209, 210; 165/80.6, 80.3, 104.33; 437/8

[56] References Cited

U.S. PATENT DOCUMENTS 4,881,591  11/1989  Rignabl ................................. 324/760
5,233,161  8/1993  Farewell et al. ...................... 324/158.1
5,406,212  4/1995  Hashinaga et al. ................... 324/765
5,414,370  5/1995  Hashinaga et al. ................... 324/760

FOREIGN PATENT DOCUMENTS 2-52263  2/1990  Japan .

Primary Examiner—Vinh P. Nguyen
Attorney, Agent, or Firm—Foley & Lardner

[57] ABSTRACT

In an IC tester configured to simultaneously test a plurality of test ICs, each of the test ICs includes a temperature sensor part for detecting the temperature of the test IC itself. A controller receives a temperature detection signal from each test IC and controls a plurality of pulse generators each provided for supplying a pulse signal to a corresponding one of the test ICs. Each pulse generator is controlled by the controller to change the frequency of the pulse signal so as to maintain the temperature of the corresponding test IC at a target temperature in common to all the test ICs to permit simultaneous testing in the IC tester.

5 Claims, 7 Drawing Sheets

SEMICONDUCTOR DEVICE TESTER CAPABLE OF SIMULTANEOUSLY TESTING A PLURALITY OF INTEGRATED CIRCUITS AT THE SAME TEMPERATURE

BACKGROUND OF THE INVENTION

1. Field of the Invention

The present invention relates to a semiconductor device tester which gives a guarantee of reliability, and more specifically to a semiconductor device tester which is possible to make an acceleration reliability test by heating an integrated circuit to be tested (called a "test IC" in this specification).

2. Description of Related Art

A semiconductor device tester configured to individually test a semiconductor device is disclosed in Japanese Patent Application Laid-open Publication JP-A-2-052263.

A construction of this conventional semiconductor device tester is shown in FIG. 1. In the shown conventional semiconductor device tester, a test IC 102 includes a temperature sensor part 114 provided in addition to a function part 113 which is inherently required in an inside of the test IC 102. A controller 105 compares a temperature detected by the temperature sensor part 114 and outputted from a measuring part 104, with a predetermined target temperature. As the result, when the temperature detected by the temperature sensor part 114, which is a temperature in a testing apparatus 112, reaches the predetermined target temperature, a test of the test IC is begun by using a measuring device 115. When the temperature detected by the temperature sensor part 114 does not reach the predetermined target temperature, the controller 105 sends a control signal to an external heating-cooling device 103, so that the external heating-cooling device 103 heats or cools the tester 112 so as to make the temperature of the test IC 102 reach the predetermined target temperature.

As mentioned above, the conventional semiconductor device tester has been constructed to ensure the testing to be performed at a constant temperature by changing the temperature of the testing apparatus 112 by action of the external heating-cooling device 103.

However, the conventional semiconductor device tester shown in FIG. 1 is disadvantageous in that the temperature of the test IC 102 can be changed only by varying the temperature of the whole of the inner part of the testing apparatus 112 by action of the external heating-cooling device 103. When a plurality of semiconductor devices are tested together in the testing apparatus 112, even if the temperature of the testing apparatus 112 reaches the target temperature, all of the plurality of semiconductor devices are not necessarily at the same temperature, and therefore, all of the semiconductor devices cannot be tested at the same temperature.

In an accelerated reliability test of a plurality of semiconductor devices, since the acceleration coefficient depends upon an applied voltage and the temperature of the test ICs, the result of the acceleration reliability test is not reliable if the temperature of the test ICs are different from each other.

SUMMARY OF THE INVENTION

Accordingly, it is an object of the present invention to provide a semiconductor device tester which has overcome the above mentioned defect of the conventional one.

Another object of the present invention is to provide a semiconductor device tester capable of performing the reliability guarantee test (reliability accelerated life time test) of a plurality of test ICs together while maintaining the temperature of all the test ICs at a constant value.

A further object of the present invention is to provide a semiconductor device tester capable of performing the reliability guarantee test of a plurality of test ICs together at the same temperature of the test ICs, without changing an internal temperature of the whole of the testing apparatus.

The above and other objects of the present invention are achieved in accordance with the present invention by a semiconductor device tester comprising a testing apparatus having an internal space in which a plurality of test IC are located, a first temperature measuring means for measuring an internal temperature of the testing apparatus, a second temperature measuring means for measuring the temperature of each of the test ICs, a controller connected to the first measuring means and the second measuring means and for generating a first control signal in response to a signal from the first measuring means and for generating second control signals in response to input signals from the second measuring means, a heating-cooling device responding to the first control signals to control the internal temperature of the testing apparatus, and a pulse generator means supplying a pulse signal to each test IC, and responding to the second control signals for changing a frequency of the pulse signal so as to maintain the temperature of each test IC at a target temperature.

The above and other objects, features and advantages of the present invention will be apparent from the following description of preferred embodiments of the invention with reference to the accompanying drawings.

DESCRIPTION OF THE PREFERRED EMBODIMENTS

Figure 2:
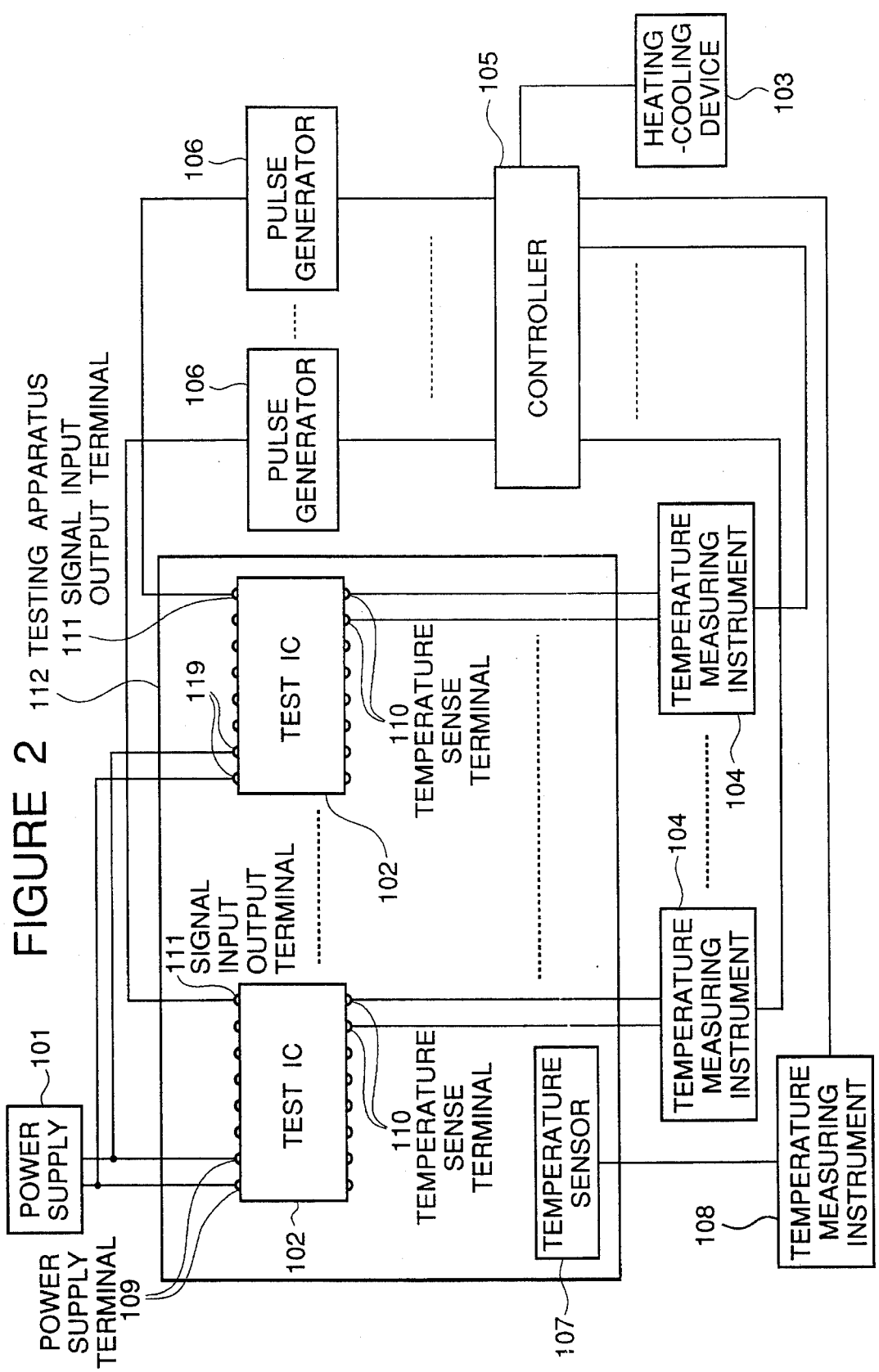
FIG. 2 is a block diagram of a first embodiment of the semiconductor device tester in accordance with the present invention.

Referring to FIG. 2, there is shown a block diagram of a first embodiment of the semiconductor device tester in accordance with the present invention.

Figure 3:
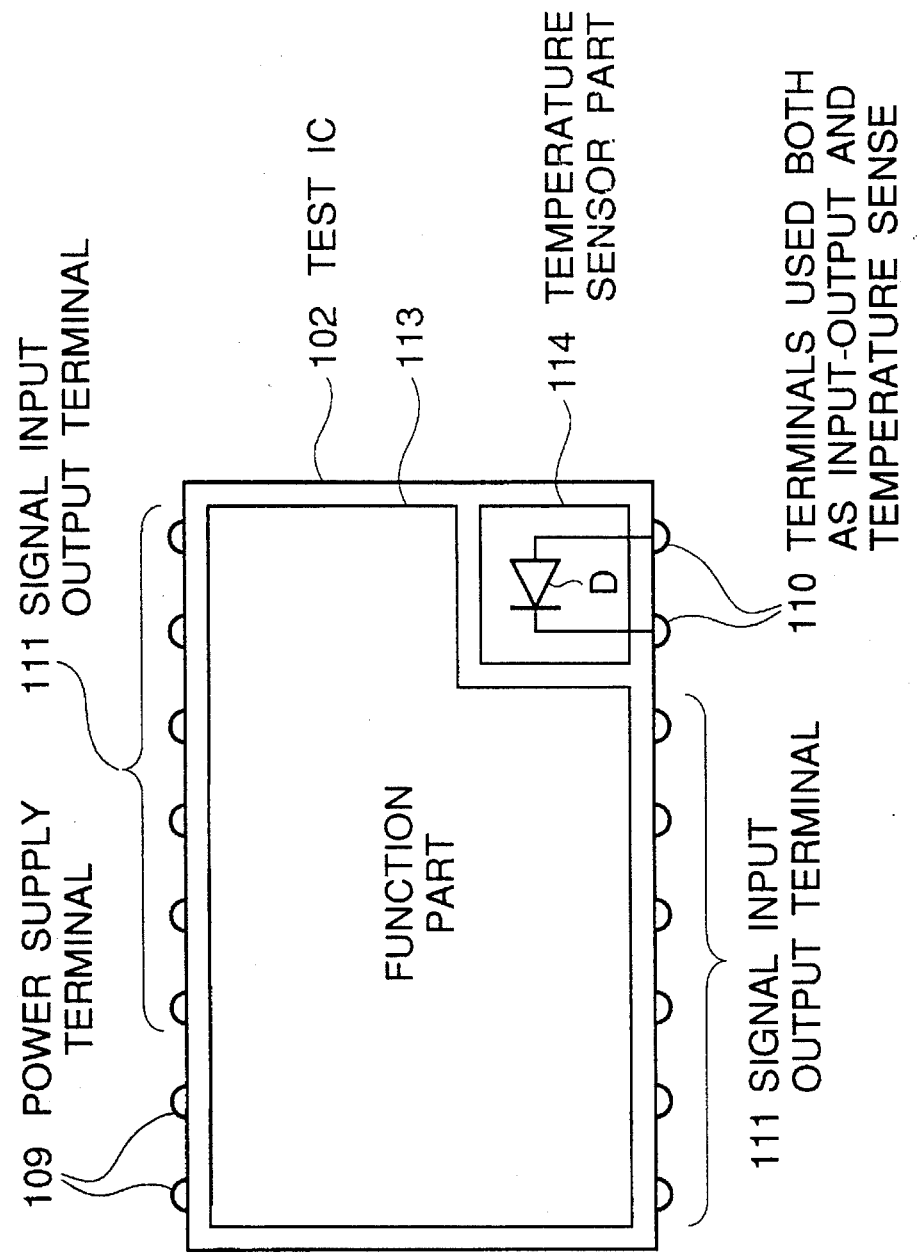
FIG. 3 illustrates a first structure of a test IC to be tested in the semiconductor tester in accordance with the present invention.

The semiconductor device tester shown in FIG. 2 is used for simultaneously testing a plurality of test ICs 102 each of which includes a function part 113 and a temperature sensor part 114 as shown in FIG. 3 in detail. Each test IC 102 includes a pair of power supply terminals 109, a pair of temperature sense terminals 110 and a number of signal input/output terminals 111, as shown in FIG. 3.

The semiconductor device tester includes a testing apparatus 112 having an internal space in which the plurality of test ICs 102 are located and set, a power supply 101 which supplies an electric power to the power supply terminals 109 of each test IC 102 set in the testing apparatus 112, and a plurality of temperature measuring instruments 104 each connected to the temperature sense terminals 110 of a corresponding one of the test ICs 102.

The semiconductor device tester also includes a temperature sensor 107 located in the internal space of the testing apparatus 112, a temperature measuring instrument 108 connected to the temperature sensor 107, a controller 105 connected to both of the temperature measuring instruments 104 and the temperature measuring instrument 108, an external heating-cooling device 103 controlled by the controller 105 for heating and cooling the internal space of the testing apparatus, a plurality of pulse generators 106 each controlled by the controller 105 and connected to a predetermined one of the signal input/output terminals 111 of a corresponding one of the test ICs 102. Accordingly, one temperature measuring instrument 104 and one pulse generator 106 are provided for each one test IC 102. In addition, the predetermined one of the signal input/output terminals 111 connected to the pulse generator 106 is a signal input terminal or a signal input/output terminal, since it is sufficient if the pulse signal is actually applied in an internal circuit of the test IC so as to cause the test IC to generate heat. Accordingly, a terminal used only for a signal output cannot be connected to the pulse generator 106.

The semiconductor device tester of FIG. 2 uses the test ICs as shown in FIG. 3. A diode D formed in the test IC is used as the temperature sensor part 114 of the test IC. The diode is formed together with the function part 113 of the test IC in a process for fabricating the function part 113 of the test IC. Accordingly, the temperature characteristic of the diode is the same as that of elements included in the function part 113. The reason why the diode is used as the temperature part 114 is that the voltage between an anode and a cathode of the diode depends upon the temperature of the diode, and therefore, a temperature of the test IC can be known by measuring the voltage between the anode and the cathode of the diode.

At first, a plurality of test ICs 102 are sets in the testing apparatus 112, and the power supply 109 is connected to the power supply terminals 109 of all the test ICs 102. Furthermore, each pulse generator 106 is connected to the predetermined signal input/output terminal 111 of a corresponding one test IC 102, and the temperature sensor terminals 110 of each test IC 102 are connected to a corresponding one temperature measuring instrument 104.

Then, the temperature-frequency characteristic of the test IC is measured with various frequencies applied to the diode by the controller 105, without operating the external heating-cooling device 103, namely without heating the internal space of the testing apparatus 112. The temperature-frequency characteristic can be obtained by using the relation between a frequency and a current: I=fCV (where I=current, f=frequency, C=capacity, V=voltage). Namely, it uses the phenomena that the diode current varies with variation of the frequency, and the power consumption varies with variation of the current, with the result that a junction temperature of the diode changes with the variation of the frequency.

Figure 7:
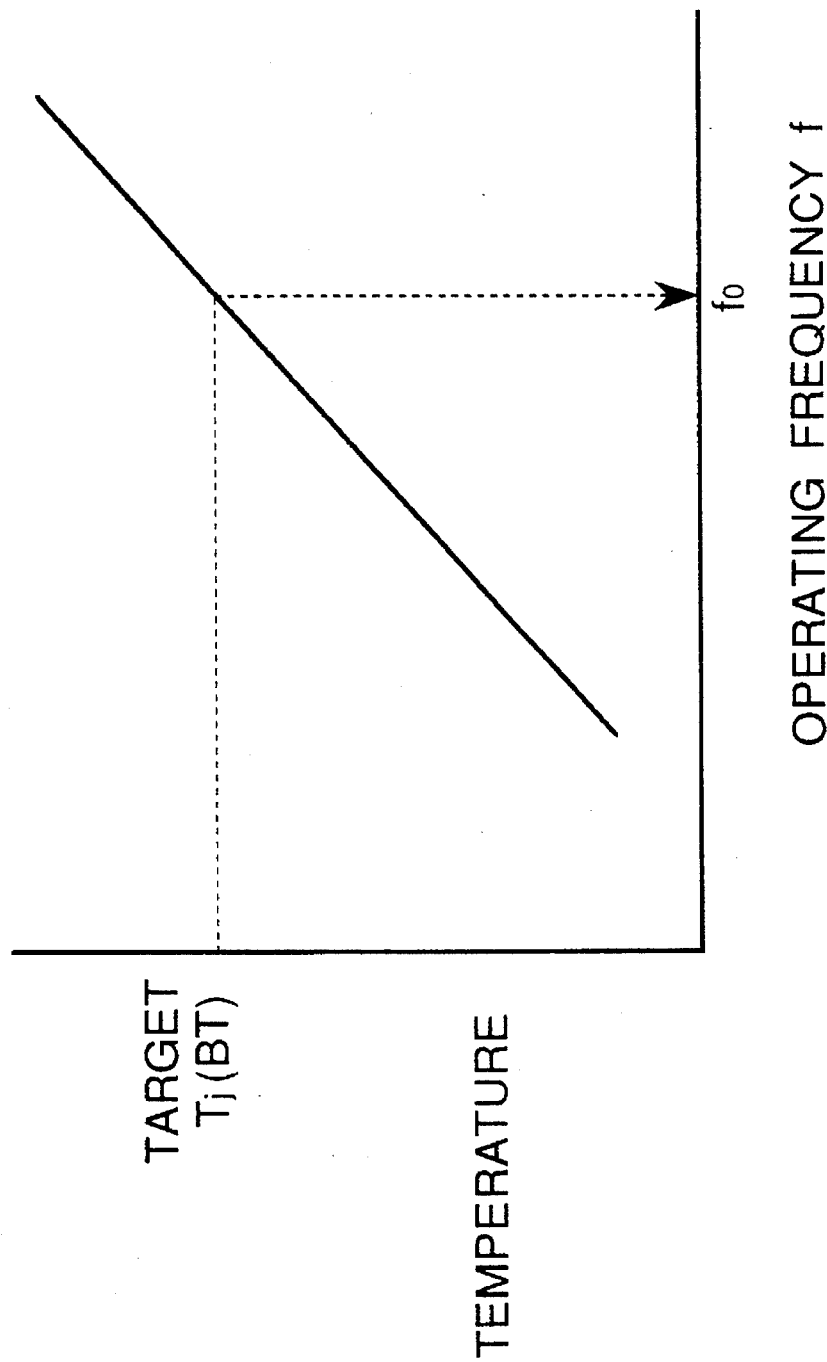
FIG. 7 is a graph showing a relation between temperature and frequency.

For obtaining the temperature-frequency characteristic of test IC, the controller 105 generates the control signal for controlling the output frequency of each pulse generator 106 to be supplied to the corresponding test IC 102, and each pulse generator 106 changes the output pulse frequency to the corresponding test IC 102 based on the control signals generated by the controller 105. The measuring method is to repeat, a predetermined number of times, an operation in which the junction temperature is measured each time a different frequency pulse is supplied to the test IC 102. In this manner, the characteristics of the junction temperature to the pulse frequency can be obtained. FIG. 7 shows one example of the characteristics of the junction temperature and the operating frequency.

After the temperature-operating frequency characteristics is determined in accordance with the above procedure, the temperature of the internal space of the testing apparatus 112 is brought to a predetermined target temperature, by the controller 105 which controls the external heating-cooling device 103 on the basis of the temperature measured with the temperature sensor 107 and the temperature measuring instrument 108.

Next, on the basis of the characteristics obtained as mentioned above of the junction temperature and the operating frequency, the controller 105 determines the operating pulse frequency $f_0$ to be supplied to each test IC 102, and supplies the control signals to the pulse generators 106, respectively, so as to cause each of the pulse generators 106 to output the pulse of the operating frequency $f_0$ to the corresponding test IC for the purpose of bringing the junction temperature of each test IC 102 to the target temperature.

The junction temperature of each test IC 102 is ceaselessly continuously detected with the temperature sensor 114 provided in each test IC 102, and signals generated by each temperature measuring instrument 104 based on the detected junction temperature is input to the controller 105. During the testing process, therefore, even if the junction temperature of a test IC varies from the target temperature, the controller 105 changes the operating frequency of the pulse generator 106 corresponding to the test IC whose junction temperature has changed from the target temperature, on the base of the temperature-frequency operating characteristic, and supplies the control signal to the corresponding pulse generator 106 so as to cause the corresponding pulse generator 106 to output the changed operating frequency. Thus, the pulse of the changed operating frequency is input to the corresponding test IC 102, and the accelerated life time test is done while keeping each test IC 102 at the same constant junction temperature.

Namely, without changing the internal temperature of the testing apparatus 112, the junction temperature of all the test ICs 102 can be controlled constant by changing the input pulse frequency determined in accordance with the temperature-operating frequency characteristic on the basis of the temperature detected by the temperature sensor part 114. Namely, the junction temperature of each test IC 102 can be controlled by feeding back the variation of each junction temperature.

Figure 1:
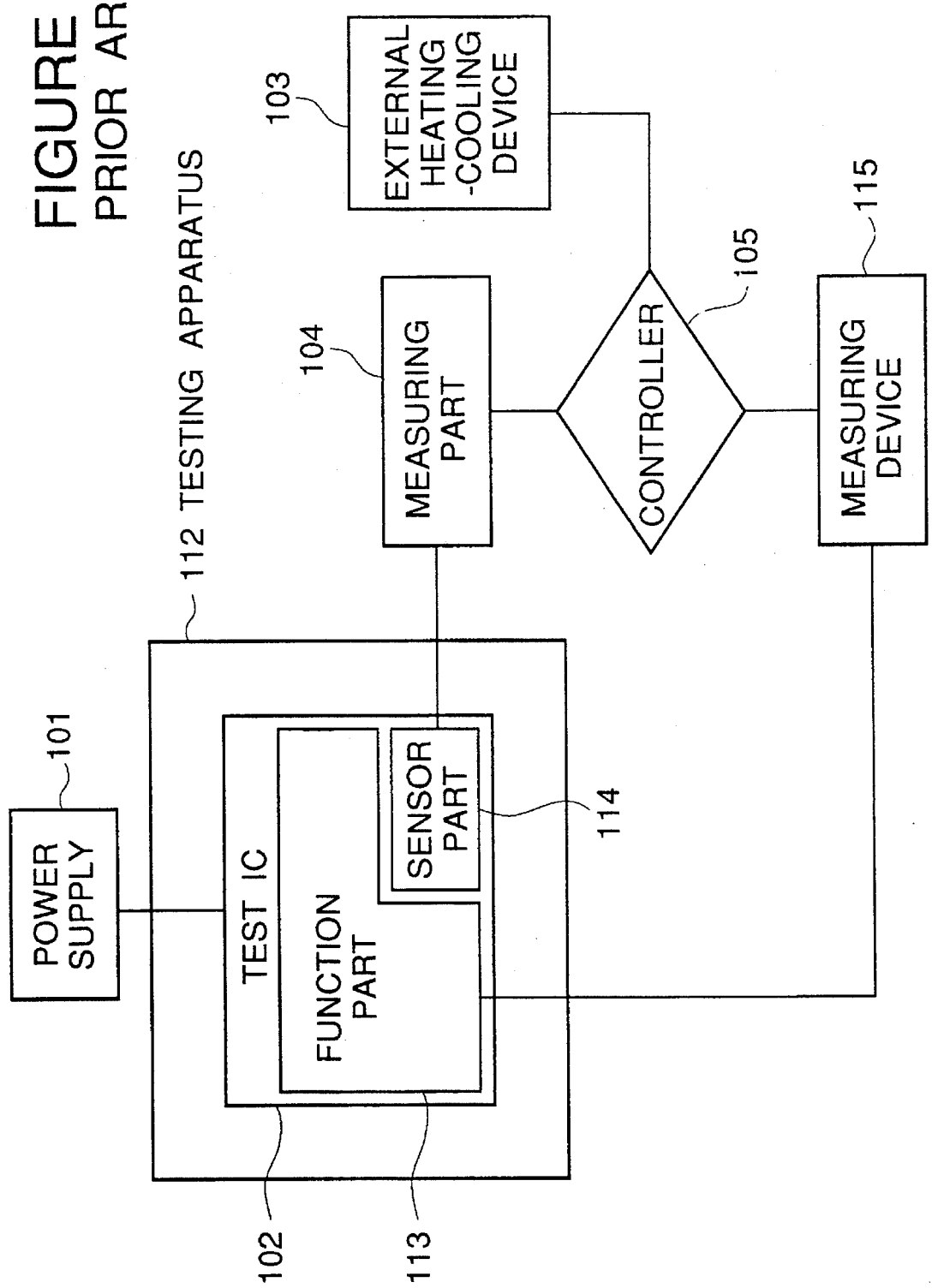
FIG. 1 shows a block diagram of a semiconductor device tester in the prior art.
Figure 4:
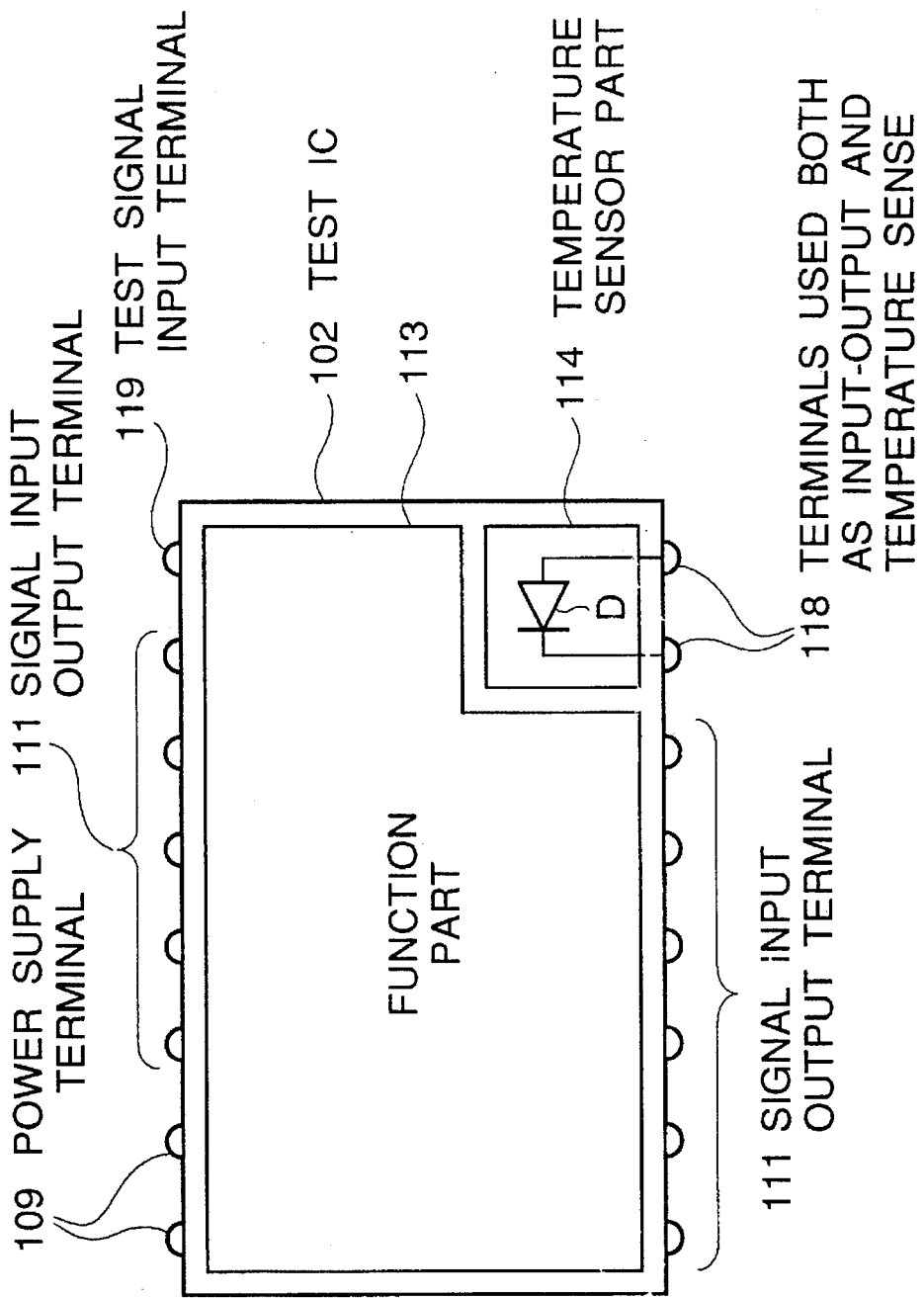
FIG. 4 illustrates a second structure of a test IC to be tested in the semiconductor tester in accordance with the present invention.

In the above mentioned explanation, the test IC 102 shown in FIG. 3 is used, but a test IC shown in FIG. 4 can be used also for the first embodiment of FIG. 1. The test IC 102 of FIG. 3 needs the temperature sense terminals 110 newly provided in addition to the power supply terminals 109 and the signal input/output terminals 111 which are provided ordinarily. Therefore, when the number of terminals of the test IC 102 is small, it is necessary that some of the ordinary signal input/output terminals 111 are used as the temperature sense terminals 110.

For this purpose, the test IC 102 shown in FIG. 4 is so constructed that when, a predetermined voltage, for example, a negative voltage, is supplied from the controller 105 to a test signal input terminal 119 which is, in an ordinary case (a non-testing condition), used as a signal input/output terminal, a pair of outputs of the temperature sensor part 114 of the test IC 112 are internally connected to a pair of terminals 118, which are also, in an ordinary case (a non-testing condition), used as a signal input/output terminal. Therefore, the test IC 102 shown in FIG. 4 having only a small number of terminals can be tested.

Figure 5:
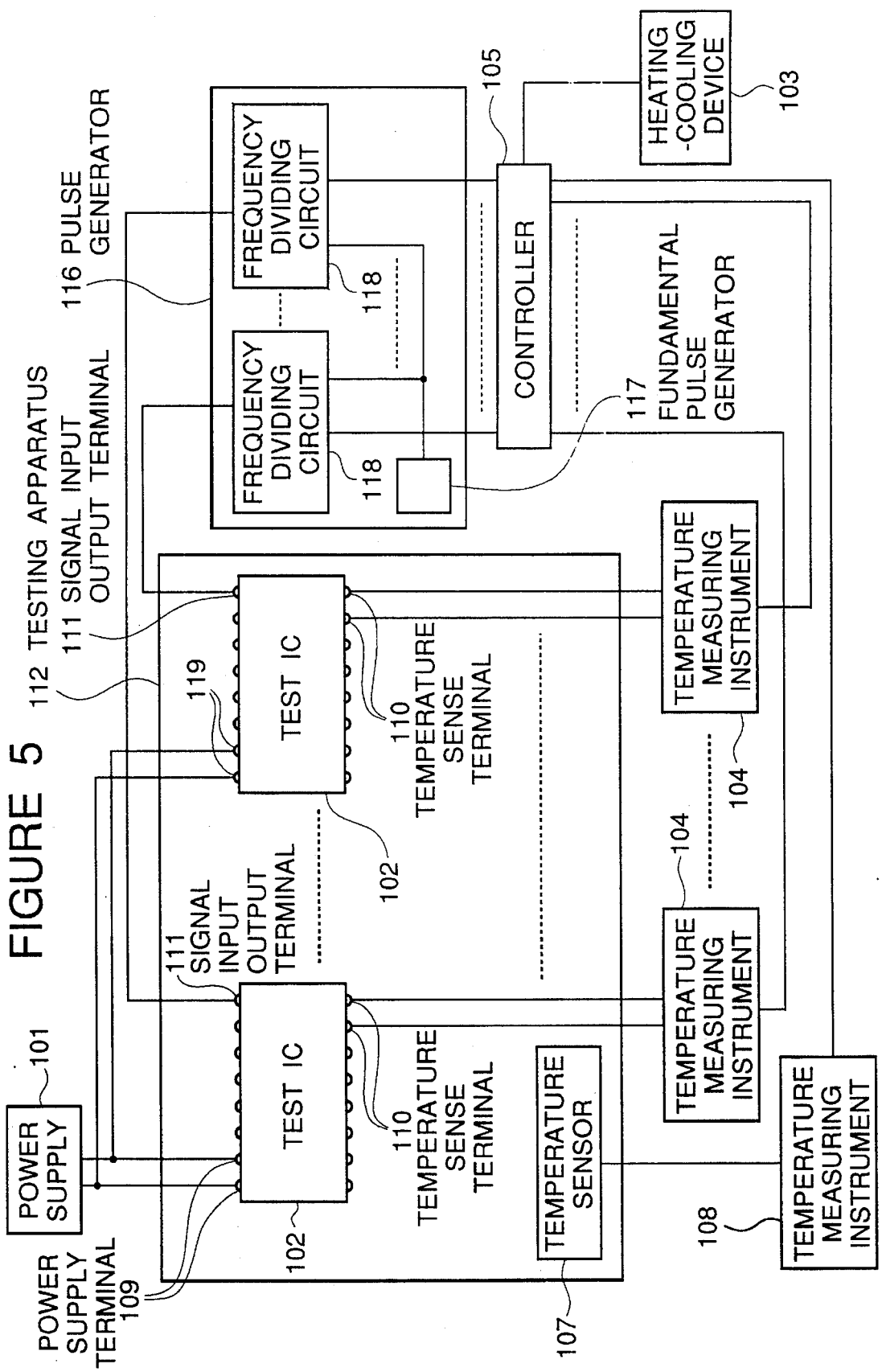
FIG. 5 is a block diagram of a second embodiment of the semiconductor device tester in accordance with the present invention.

Referring to FIG. 5, there is shown a block diagram of a second embodiment of the semiconductor device tester in accordance with the present invention. In FIG. 5, elements similar to those shown in FIG. 2 are given the same reference numerals, and explanation thereof will be omitted for simplification of description.

In the second embodiment, the plurality of pulse generators 106 in the first embodiment are replaced with one pulse generator 116, which includes a common fundamental pulse generator 117 and frequency-dividing circuits 118 of the number corresponding to that of the test ICs 102. Each of the frequency-dividing circuits 118 receives a fundamental pulse generated in the common fundamental pulse generator 117 and the control signal supplied from the controller 105 so as to frequency-divide the fundamental pulse in accordance with the control signal supplied from the controller 105 so that a pulse of a desired frequency is supplied to the corresponding test IC.

The construction and the operation of the other parts of the second embodiment are the same as those of the first embodiment, and therefore, a further explanation will be omitted.

Figure 6:
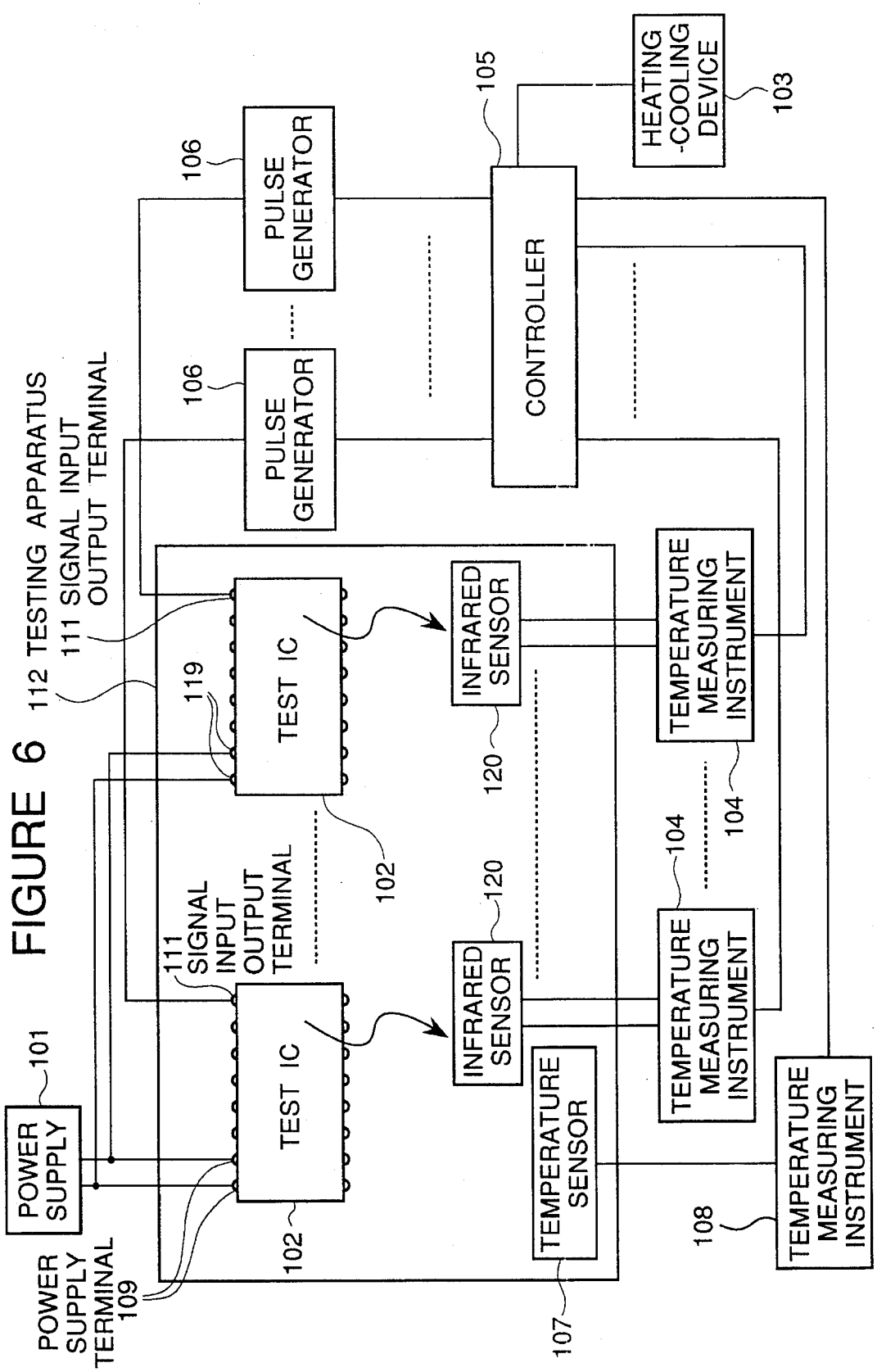
FIG. 6 is a block diagram of a third embodiment of the semiconductor device tester in accordance with the present invention.

Referring to FIG. 6, there is shown a block diagram of a third embodiment of the semiconductor device tester in accordance with the present invention. In FIG. 6, elements similar to those shown in FIG. 2 are given the same reference numerals, and explanation thereof will be omitted for simplification of description.

The testing apparatus 112 includes a plurality of infrared sensors 120, each of which detects the temperature of a corresponding test IC 102 and outputs a detected temperature signal to a corresponding temperature measuring instrument 104. In this third embodiment, it is possible to test a test IC 102 which does not include an additional element (such as the temperature sensor part 114) other than the functional part 113.

The construction and the operation of the other parts of the third embodiment are the same as those of the first embodiment, and therefore, a further explanation will be omitted.

As mentioned above, the reliability guarantee test (reliability accelerated life time test) of a plurality of test ICs can be simultaneously made while maintaining the plurality of test ICs at a constant temperature only by changing the pulse frequency supplied to each test IC without changing the temperature of the internal space of the tester. Therefore, the plurality of test ICs can be tested in the same temperature condition, so that the result of the reliability test is very accurate and highly reliable.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device tester comprising a testing apparatus having an internal space in which a plurality of test ICs are located, a first temperature measuring means for measuring an internal temperature of the testing apparatus, a second temperature measuring means for measuring the temperature of each of the test ICs, a controller connected to the first measuring means and the second measuring means and for generating a first control signal in response to a signal from the first measuring means and for generating second control signals in response to input signals from the second measuring means, a heating-cooling device responding to the first control signal to control the internal temperature of the testing apparatus, and pulse generator means supplying a pulse signal to each IC, and responding to the second control signals for changing a frequency of each pulse signal so as to maintain the temperature of each test IC at the same target temperature.

2. A semiconductor device tester claimed in claim 1 wherein each of said test ICs includes a function part which is necessary for an ordinary use and a temperature sensor part for detecting the temperature of the test IC itself, an output of said temperature sensor part of each test IC being supplied to said controller through said second temperature measuring means.

3. A semiconductor device tester claimed in claim 2 wherein said temperature sensor part is formed of a semiconductor device formed in said test IC.

4. A semiconductor device tester claimed in claim 2 wherein each of said test ICs is so configured that, when a predetermined pulse signal is input into a predetermined one of a plurality of signal input/output terminals of the test IC, said temperature sensor part of the test is connected to a different predetermined one said plurality of signal input/output terminals.

5. A semiconductor device tester claimed in claim 1 wherein said pulse generator means includes a plurality of pulse generators each of which is connected to a corresponding one of said test ICs and each of which is controlled by said controller so as to supply said corresponding test IC with said pulse having a frequency controlled by said controller.

* * * * *